United States Patent
Woodruff et al.

(10) Patent No.: US 6,322,677 B1
(45) Date of Patent: Nov. 27, 2001

(54) LIFT AND ROTATE ASSEMBLY FOR USE IN A WORKPIECE PROCESSING STATION AND A METHOD OF ATTACHING THE SAME

(75) Inventors: Daniel J. Woodruff, Kalispell, MT (US); Martin C. Bleck, Eagle, ID (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/604,041

(22) Filed: Jun. 27, 2000

Related U.S. Application Data (62) Division of application No. 09/351,980, filed on Jul. 12, 1999, now Pat. No. 6,168,695.

(51) Int. Cl.[7] .................................................. C25D 17/04
(52) U.S. Cl. ............................... 204/297.06; 204/297.07; 204/297.08; 118/500
(58) Field of Search .................. 204/297.06, 297.07, 204/297.08; 118/620, 232, 244, 209, 500; 269/309

(56) References Cited

U.S. PATENT DOCUMENTS

| | | |
|---|---|---|
| 4,761,214 | 8/1988 | Hinman . |
| 5,222,310 | 6/1993 | Thompson et al. . |
| 5,227,041 | 7/1993 | Brogden et al. . |
| 5,377,708 | 1/1995 | Bergman et al. . |
| 5,670,034 | 9/1997 | Lowery . |
| 5,762,751 | 6/1998 | Bleck et al. . |
| 5,785,826 | 7/1998 | Greenspan . |
| 5,985,126 | 11/1999 | Bleck et al. . |
| 6,004,828 | 12/1999 | Hanson . |
| 6,168,695 | 1/2001 | Woodruff et al. . |

*Primary Examiner*—Kathryn Gorgos
*Assistant Examiner*—Thomas H Parsons
(74) *Attorney, Agent, or Firm*—Perkins Coie LLP (57) ABSTRACT

A lift and rotate assembly for use in a workpiece processing station. The lift and rotate assembly includes a body having a slim profile and pins located on opposite sides for mounting the assembly onto a tool frame. The lift and rotating assembly further includes a rotating mechanism coupling a processing head to the body, and for rotating the process head with respect to the body. The rotating mechanism includes a motor, wherein the motor is located within the processing head and the shaft of the motor is coupled to and rotationally fixed with respect to the body. The lift and rotate assembly further includes a lift mechanism for lifting the process head with respect to the body. A cable assembly within the lift and rotate assembly includes a common cable loop for feeding additional length of cable along both the lift direction and the rotational direction of movement.

7 Claims, 9 Drawing Sheets

LIFT AND ROTATE ASSEMBLY FOR USE IN A WORKPIECE PROCESSING STATION AND A METHOD OF ATTACHING THE SAME

CROSS-REFERENCE TO RELATED APPLICATIONS

This is a divisional application of U.S. patent application Ser. No. 09/351,980, filed Jul. 12, 1999, entitled LIFT AND ROTATE ASSEMBLY FOR USE IN A WORKPIECE PROCESSING STATION AND A METHOD OF ATTACHING THE SAME now U.S. Pat. No. 6,168,695.

STATEMENT REGARDING FEDERALLY SPONSORED RESEARCH OR DEVELOPMENT

Not Applicable

BACKGROUND OF THE INVENTION

The present invention is directed to an apparatus for processing of semiconductor wafers, and in particular, a lift and rotate assembly for use in a workpiece processing station.

During the manufacture of semiconductor integrated circuits and other semiconductor articles from semiconductor wafers, it is often necessary to perform several processing steps in one or more processing stations. In order to more fully automate the process and minimize operator handling, tool architectures have been developed incorporating multiple processing stations and automated means for moving semiconductor wafers from one processing station to the next.

When developing a tool architecture one consideration is the overall size of a tool. One reason for this is because the manufacture of semiconductor integrated circuits typically take place in a clean room environment, where the creation and maintenance of clean room space has a relatively higher cost, which is related to the size of the space. As a result, efforts and developments which reduce the overall tool size can have a significant cost benefit.

Tool size can often be an important consideration when adding to and/or updating a particular tool in a line. If the size and shape of the new tool is equal to or smaller than the available space or the space created by the removal of the old tool being replaced, the impact on nearby tools is minimized. In contrast, when a new or replacement tool is larger than the available space or the space required by the previous tool, it can potentially require the adjustment and/or relocation of the placement of nearby tools.

One reason to update one or more tools in a semiconductor manufacturing line is to make a transition from a smaller to a larger wafer size. The use of larger wafer sizes is desirable because it enables a greater number of devices to be manufactured on each wafer. By producing more devices on each wafer the cost of manufacturing each device can often be reduced.

Whereas the present standard wafer size for a majority of semiconductor manufacturing lines is 200 millimeters, there is an increasing trend toward the use of 300 millimeter wafers. Therefore, efforts at minimizing or maintaining tool size, while enabling the tool to handle larger wafer sizes would similarly be beneficial.

Another consideration when developing a tool architecture is ease of maintenance. Occasionally individual processing stations or portions thereof, need to be removed for regular cleaning and/or maintenance, or replacement. The easier it is to service the assembly or subassembly requiring maintenance, the less time a tool will be down or out of service.

Ease of maintenance becomes especially important when one considers that, as previously noted, semiconductor manufacturing tools are often located in a clean room environment. In clean room environments, personnel are typically required to wear protective clothing including gloves, coats, masks, etc., which can make even routine tasks more cumbersome. Therefore, improvements in accessibility of installed assemblies and/or subassemblies and the ease of installation and/or removal of the same would similarly be beneficial.

BRIEF SUMMARY OF THE INVENTION

A lift and rotate assembly for use in a workpiece processing station is provided. The lift and rotate assembly comprises a body and a process head for receiving a workpiece. The process head is coupled to the body by a rotating mechanism enabling the process head to rotate with respect to the body.

In at least one embodiment, the rotating mechanism includes a motor, wherein the motor is located within the process head. The shaft of the motor is coupled to and rotationally fixed with respect to the body.

In at least an other embodiment, the lift and rotate assembly further includes a lift mechanism for lifting the portion of the body coupled to the process head with respect to the other portion of the body, in addition to the rotating mechanism.

The lift and rotate assembly further provides for a cable assembly providing at least one of signals, gases, and fluids to the processing head. The cable assembly includes a common cable loop for feeding additional length of cable along both the lift direction of movement by the lift mechanism and the rotational direction of movement by the rotating mechanism.

In a further embodiment, the lift and rotate assembly provides for pins adapted for mounting the assembly to an exposed surface of a tool frame.

DETAILED DESCRIPTION OF THE INVENTION

Figure 1:
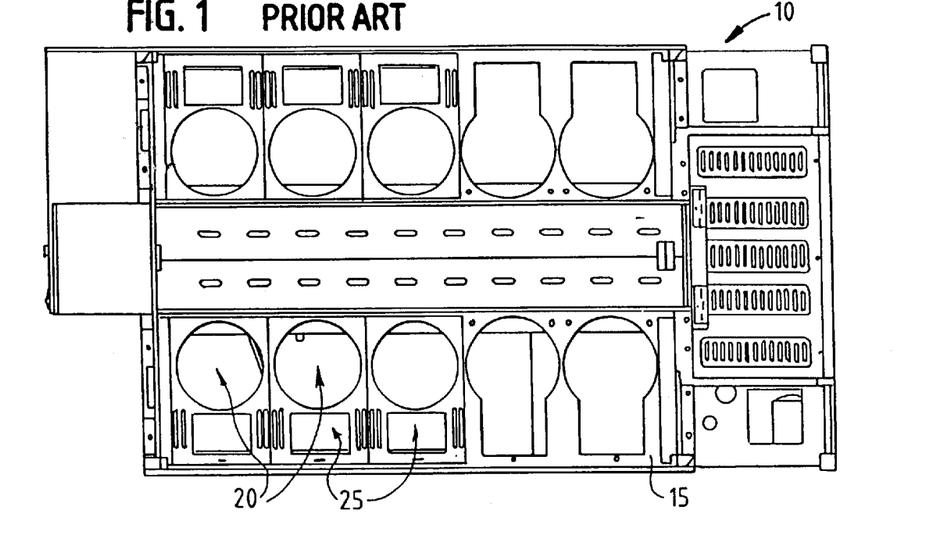
FIG. 1 illustrates a top plan view of a prior art processing tool.

FIG. 1 illustrates a top plan view of one example of a prior art processing tool 10. Specifically, FIG. 1 illustrates a top plan view of the top deck 15 of an LT-210™ processing tool manufactured by Semitool, Inc. The LT-210™ processing tool is a tool architecture designed for processing semiconductor wafers up to 200 millimeters in size. The deck 15 includes openings 20 and 25 within which individual processing stations or components thereof can be received. Openings 20 correspond to openings within which processing chambers/bowls are typically received. Openings 25 correspond to openings within which corresponding lift and rotate mechanisms are typically received. To install a corresponding lift and rotate assembly, the assembly is raised above the opening and a portion of the assembly is inserted into the opening 25.

Figure 2:
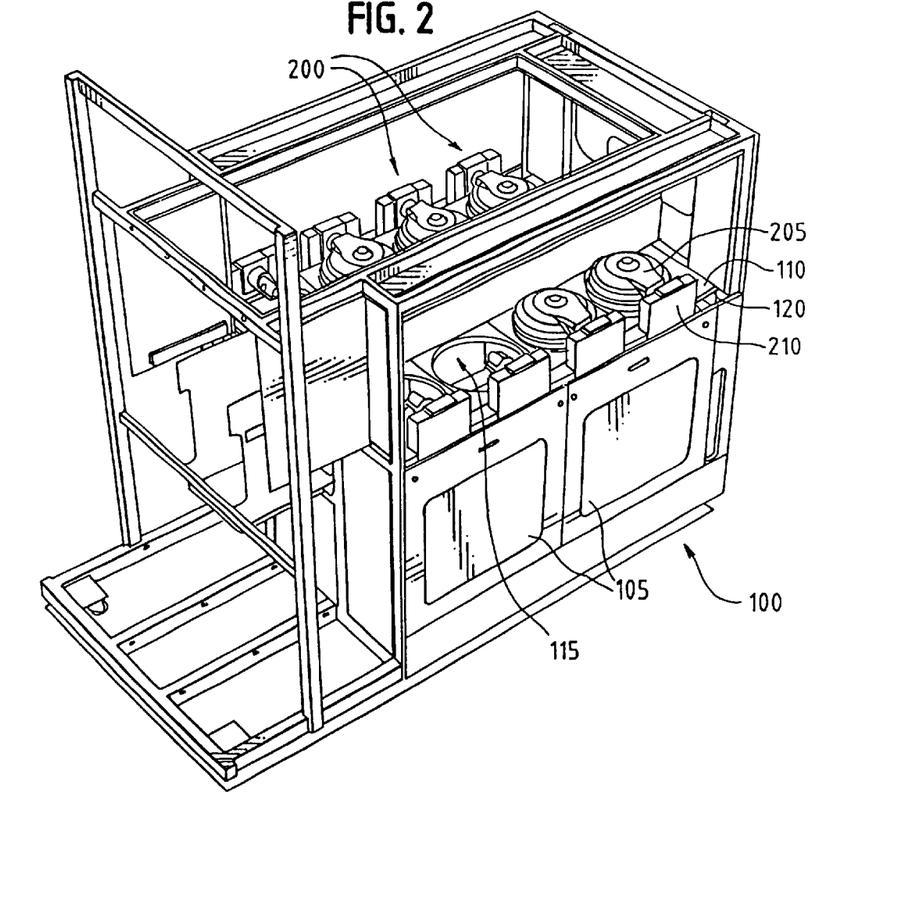
FIG. 2 illustrates an isometric view of a partial processing tool in accordance with the present invention shown with several panels removed.

FIG. 2 illustrates an isometric view of a partial processing tool 100, in accordance with the present invention. Several of the panels are shown removed, however, a pair of side panels 105 are shown still in place. FIG. 2 further shows several lift and rotate assemblies 200, which are installed in the partial processing tool 100. Some of the lift and rotate assemblies 200 are shown without their corresponding process heads 205. Similar to the processing tool 10 in FIG. 1, the processing tool 100 includes a deck 110 having openings 115 within which processing chambers/bowls 400 (FIG. 7) are typically received.

Whereas the lift and rotate assemblies of the prior art processing tool 10 (FIG. 1) have openings 25 in the deck 15 within which the lift and tilt assemblies are received, the preferred embodiment of the present invention includes lift and rotate assemblies 200, which attach at the back edge 120 of the deck 110. This enables more room on the deck for accommodating a larger processing chamber/bowl which is capable of handling larger wafer sizes.

The lift and rotate assemblies 200 can be used in conjunction with the processing chambers/bowls 400 to provide for processes including plating processes, rinse/dry processes, electroless plating processes, and/or immersion chamber processes.

Figure 3:
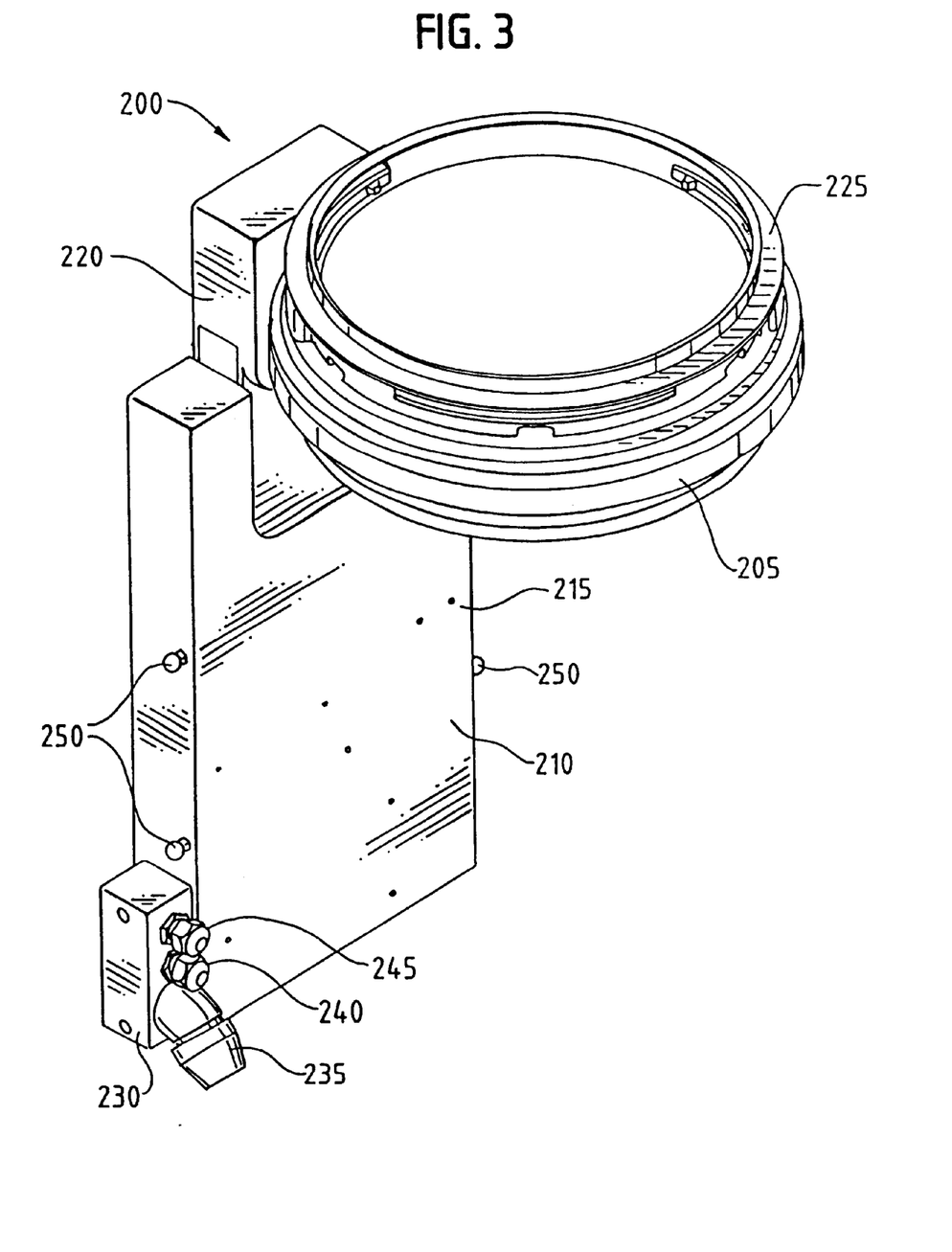
FIG. 3 illustrates an isometric front view of the lift and rotate assembly in accordance with the present invention, showing the process head lifted vertically into a raised position with the process head rotated up into a load position.
Figure 4:
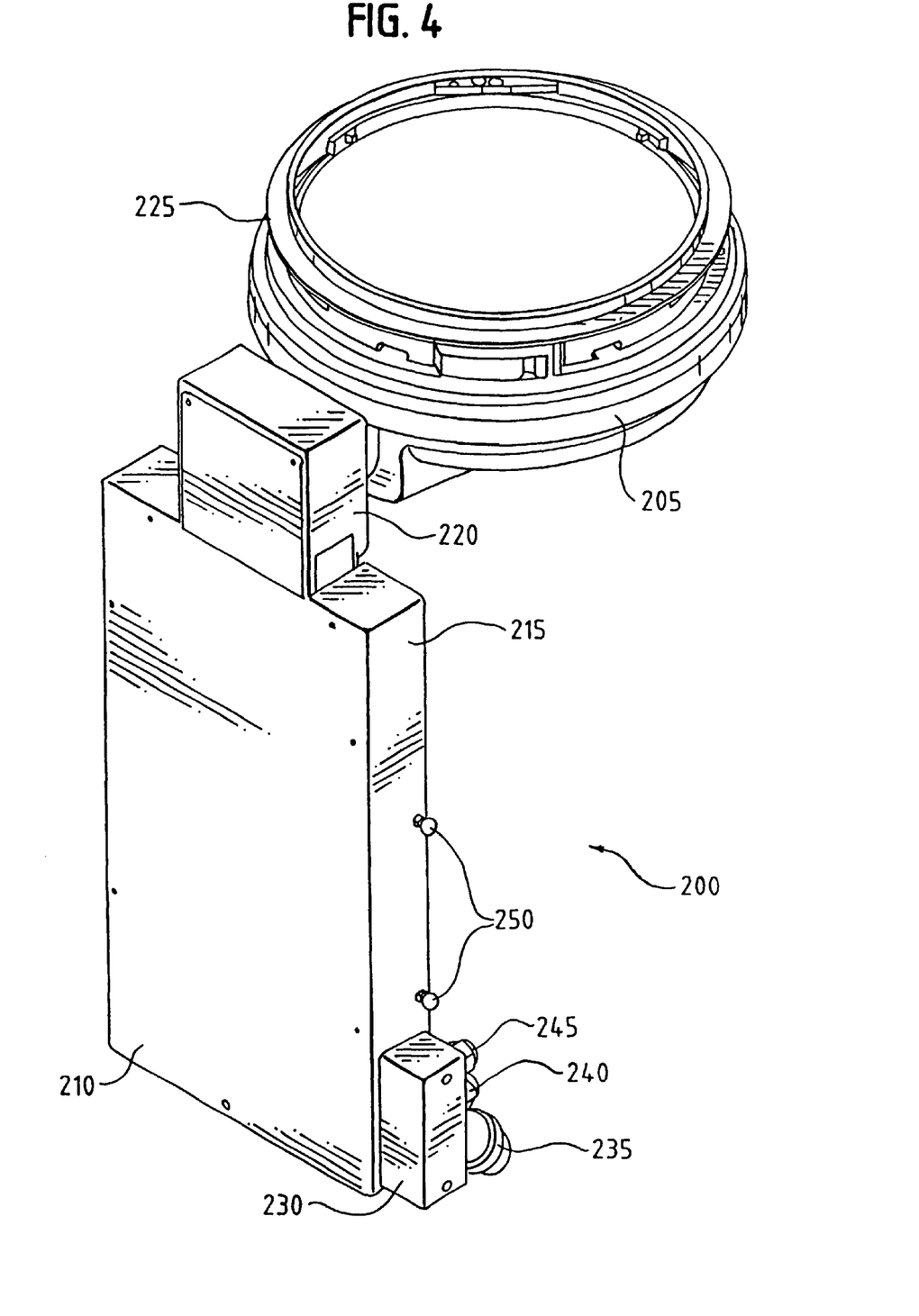
FIG. 4 illustrates an isometric back view of the lift and rotate assembly illustrated in FIG. 3.

FIGS. 3 and 4 illustrate an isometric view of each of the front and back view of the lift and rotate assembly 200. The lift and rotate assembly includes a process head 205 and a base 210. The process head 205 is rotatably coupled to the base by a rotating mechanism more clearly shown in connection with FIG. 11. The base 210 includes a first portion 215 and a second portion 220. The second portion 220 is adapted so as to be capable of being lifted with respect to the first portion 215. Specifically, the process head 205 is coupled to the second portion 220 of the base 210, so as to move with the second portion 220 as it moves with respect to the first portion 215.

In the preferred embodiment, the process head 205 is shown with a single ring contact 225, against which a wafer to be processed after being received will be held in place. In at least one preferred embodiment, the ring contact provides power to the wafer.

At the side near the bottom of the base 210 is a connection box 230 through which signals, including both communication and power signals, gases, and fluids can be received. In the preferred embodiment, the connection box 230 includes three terminals 235, 240 and 245. Terminal 235 receives electronic signals. Terminal 240 receives plating power. Terminal 245 receives gases for actuating the pneumatics and for a backside nitrogen ($N_2$) purge.

The base 210 further includes a pair of pins 250 (one not shown) on each side of the base 210. The pins 250 are adapted for mounting the lift and rotate assembly to the workpiece processing tool frame 100, shown in FIG. 2.

Figure 5:
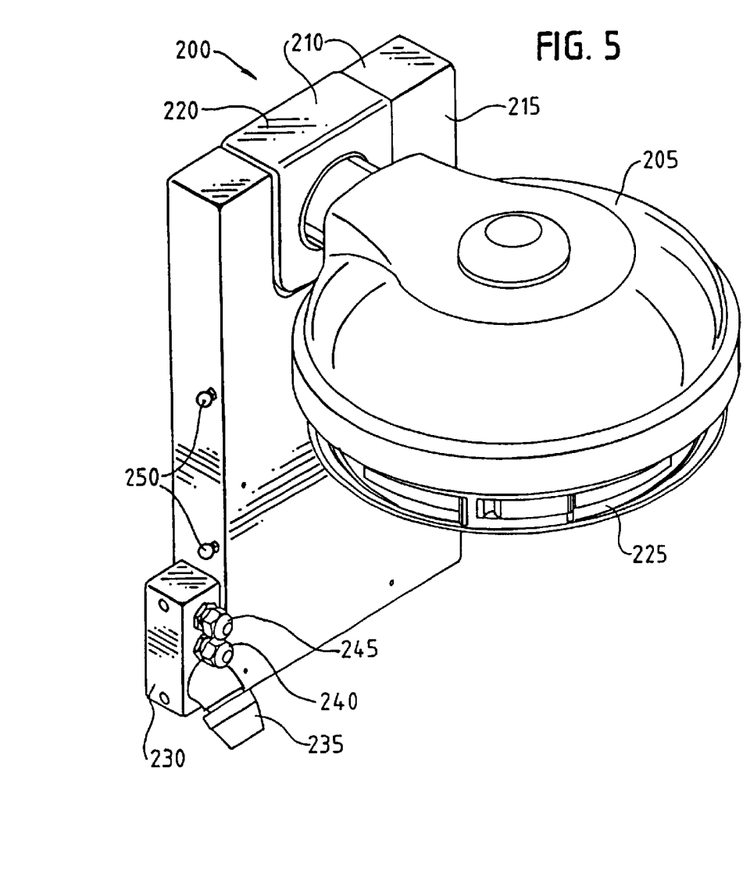
FIG. 5 illustrates an isometric front view of the lift and rotate assembly in accordance with the present invention, showing the process head lowered vertically into a lowered position with the process head rotated down into a processing position.
Figure 6:
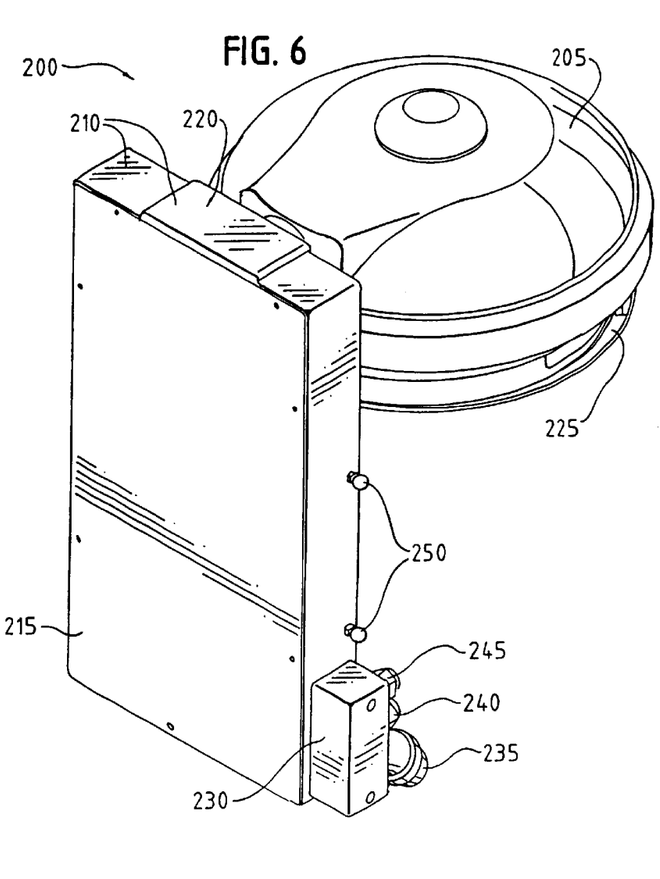
FIG. 6 illustrates an isometric back view of the lift and rotate assembly illustrated in FIG. 5.

FIGS. 5 and 6 illustrate an isometric view of each of the front and back view of the lift and rotate assembly 200 in accordance with the present invention, showing the process head 205 lowered vertically into a lowered position with the process head 205 rotated down into a processing position. Otherwise, the features are very similar to the ones shown in FIGS. 3 and 4.

Figure 7:
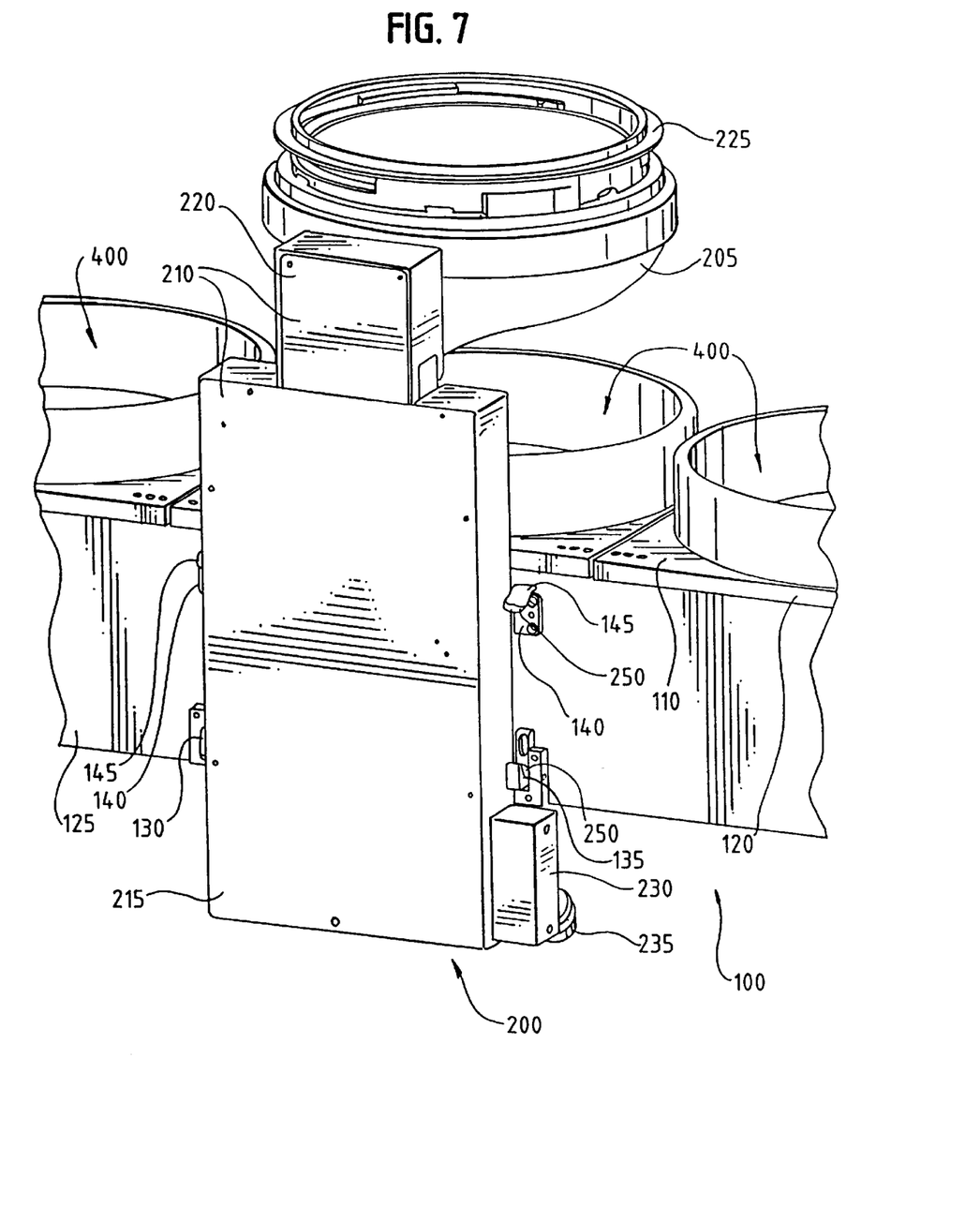
FIG. 7 illustrates an isometric view of the lift and rotate assembly mounted to an exposed surface of a processing tool with the side panel removed.

FIG. 7 illustrates an isometric view of the lift and rotate assembly 200 mounted to an exposed surface 125 of a processing tool 100 with the side panel 105, shown in FIG. 2, removed. On the exposed surface 125 of the processing tool 100 is a socket 130, a saddle 135, and a pair of adjustable surfaces 140. A pair of clips 145 captivates the two top pins 250 with respect to each of the adjustable surfaces 140. It is noted that the clips can take on a variety of forms. A couple of examples include a screw on clamp or a self retaining spring clip.

Processing chambers/bowls 400 are shown extending from openings within the deck 110.

Figure 8:
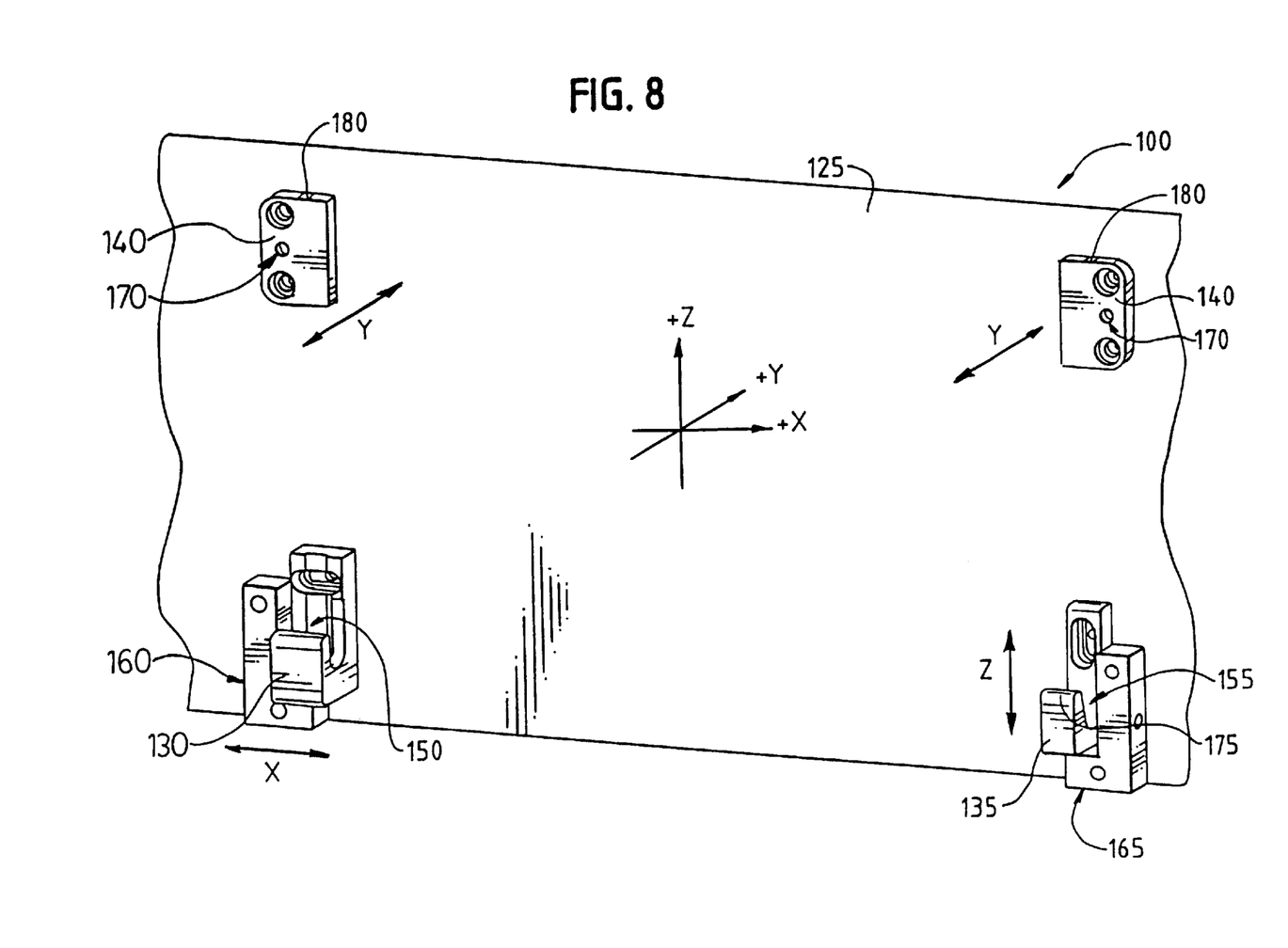
FIG. 8 illustrates an isometric view of the socket, saddle, and adjustable surfaces, coupled to an exposed surface of the processing tool, within and against which the pins of the lift and rotate assembly rest.

FIG. 8 illustrates an isometric view of the socket 130, saddle 135, and adjustable surfaces 140, coupled to an exposed surface 125 of the processing tool 100, within and against which the pins 250 of the lift and rotate assembly 200 are adapted to rest.

The socket 130 includes a spherical recess 150 for receiving a pin 250, and has a jack screw 160, which enables the socket 130 to be adjusted in a direction shown by the arrow labeled X. The saddle 135 includes a cylindrical groove 155 for receiving a pin 250, and similarly has a jack screw 165, which enables the saddle 135 to be adjusted in a direction shown by the arrow labeled Z. A pair of jack screws 170 enables the adjustable surfaces 140 to be adjusted in a direction shown by the arrows labeled Y.

Initially, when the lift and rotate assembly 200 is being installed, the lower left pin 250 is placed in the spherical groove 150 of the socket 130. With the lower left pin in place, the lower right pin 250 is then lifted up and over the lip 175 of the saddle 135 and lowered into the cylindrical groove 155.

Aided by the weight of the process head 205, the center of gravity causes the remaining two upper pins 250 of the lift and rotate assembly 200 to fall in the direction of the process head 205 until it comes into contact with the adjustable surfaces 140. In order to provide greater stability, the upper pins 250 of the lift and rotate assembly 200 are captivated against the adjustable surfaces 140. A pair of clips 145 are attached to the adjustable surfaces 140 in holes 180 located at the top of the adjustable surface. When in place, the clips 145 extend over and around the upper pins 250, as shown in FIG. 7.

The socket 130, the saddle 135, and the adjustable surfaces 140 can each be independently adjusted to provide proper alignment with the process chamber/bowl 400. Adjustment is provided by turning one or more of the jack screws.

By attaching the lift and rotate assembly 200 to the exposed surface 125 of processing tool 100 via the pins 250 and corresponding hardware 130, 135 and 140, the lift and rotate assembly 200 can be readily attached and detached from the processing tool 100. Furthermore, the full surface of the deck 110 can then be used to provide an opening for the processing chamber/bowl 400 thereby maximizing bowl size.

Another factor which influences the available space on the deck 110 is the depth D of the base 210. The depth of the base 210 is affected by the arrangement of the mechanical and electrical components inside the base 210.

Figure 9:
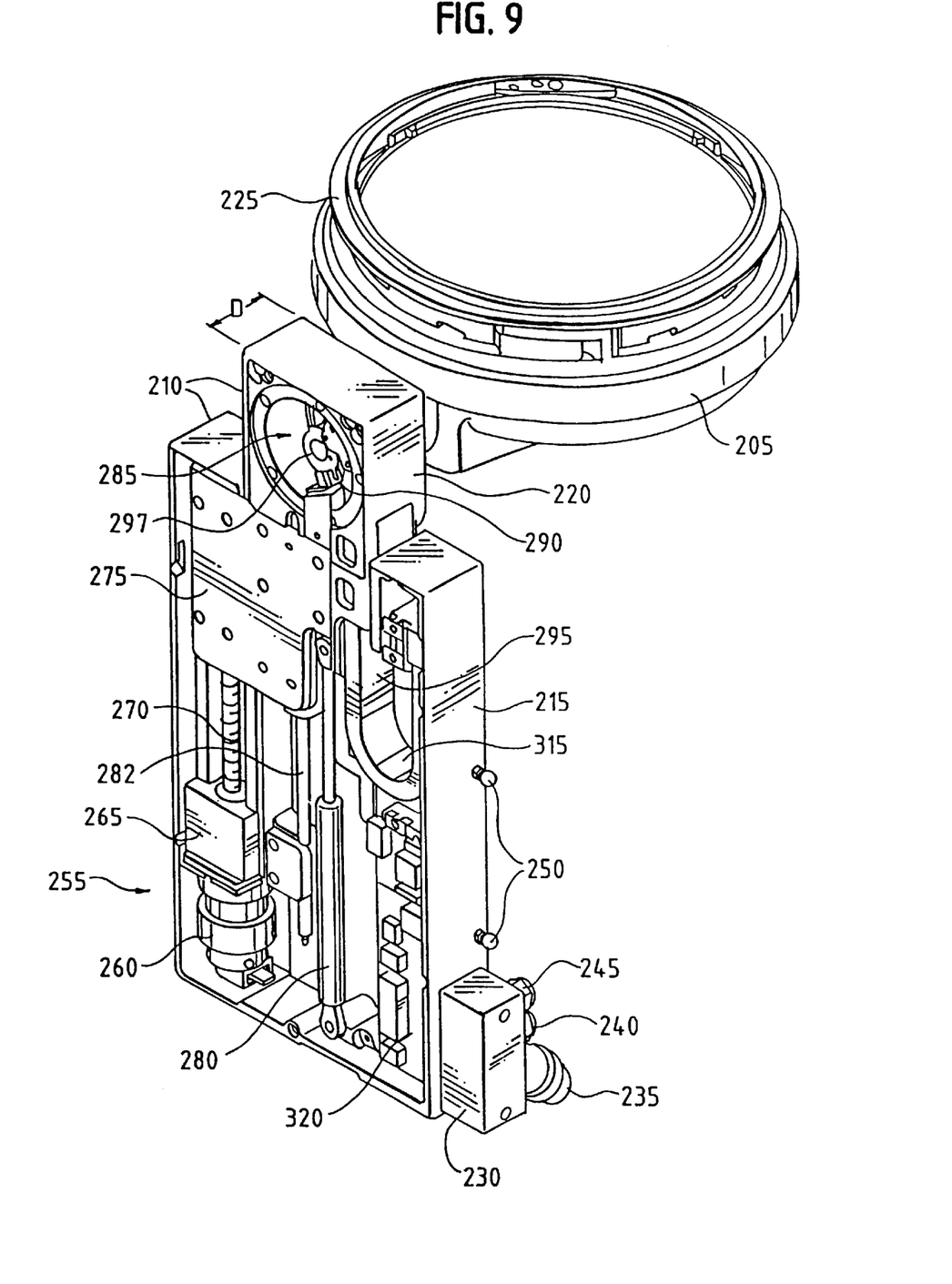
FIG. 9 illustrates the lift and rotate assembly of FIG. 4 with the back covers removed.
Figure 10:
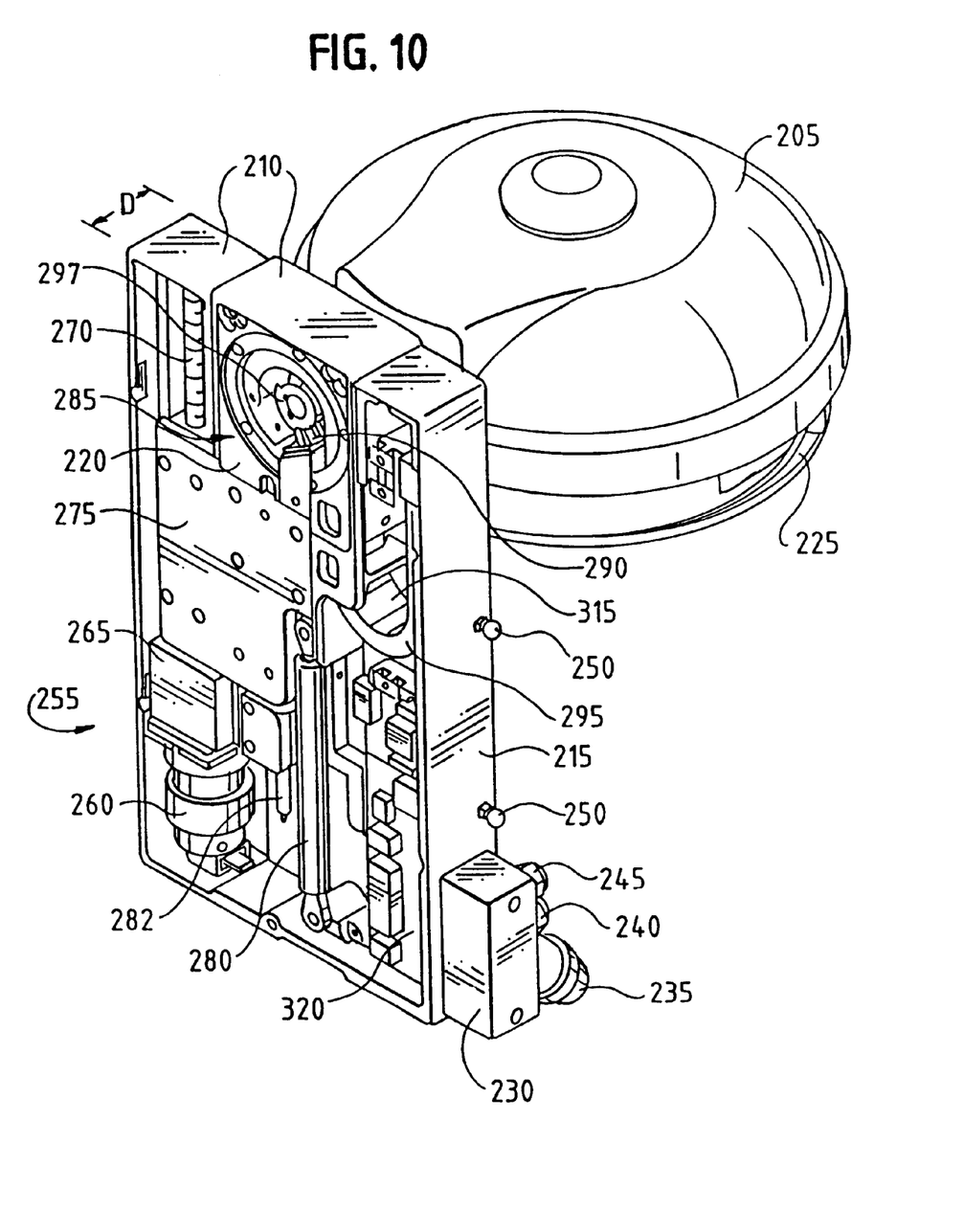
FIG. 10 illustrates the lift and rotate assembly of FIG. 6 with the back covers removed.

FIGS. 9 and 10 illustrate the lift and rotate assembly of FIGS. 4 and 6 with the back covers removed. With the back covers removed, the internal structure of the base 210 of the lift and rotate assembly 200 becomes visible.

The preferred embodiment of the lift and rotate assembly 200 includes a lift mechanism 255. The lift mechanism includes a lift axis motor 260 and a lift actuator 265, which turns a ball screw 270. As the ball screw turns, a guide block 275 travels up and down the ball screw. The guide block 275 is coupled to the second portion 220 of the base 210. Correspondingly, as the guide block 275 travels up and down in response to the turning of the ball screw 270, the second portion 220 of the base 210 is raised and lowered.

A compressed gas spring 280 is coupled between the first portion 215 and the second portion 220 of the base 210. The gas spring 280 ideally provides a counterbalance force approximately equivalent to the force of gravity being exerted on the process head 205 and related components being similarly raised and lowered. This minimizes the force required by the lift axis motor 260 for raising and lowering the process head 205.

The preferred embodiment further includes a linear encoder 282, which provides the lift mechanism 255 with absolute coordinates for locating itself Located within the second portion 220 of the base 210 is a rotate axis assembly 285. The rotate axis assembly includes a sensor 290 and a sensor flag 295 for monitoring the rotational movement of the process head 205. The rotate axis assembly is coupled to a rotating mechanism 300 (FIG. 11) including a motor 305 (FIG. 11) located in the process head 205.

Figure 11:
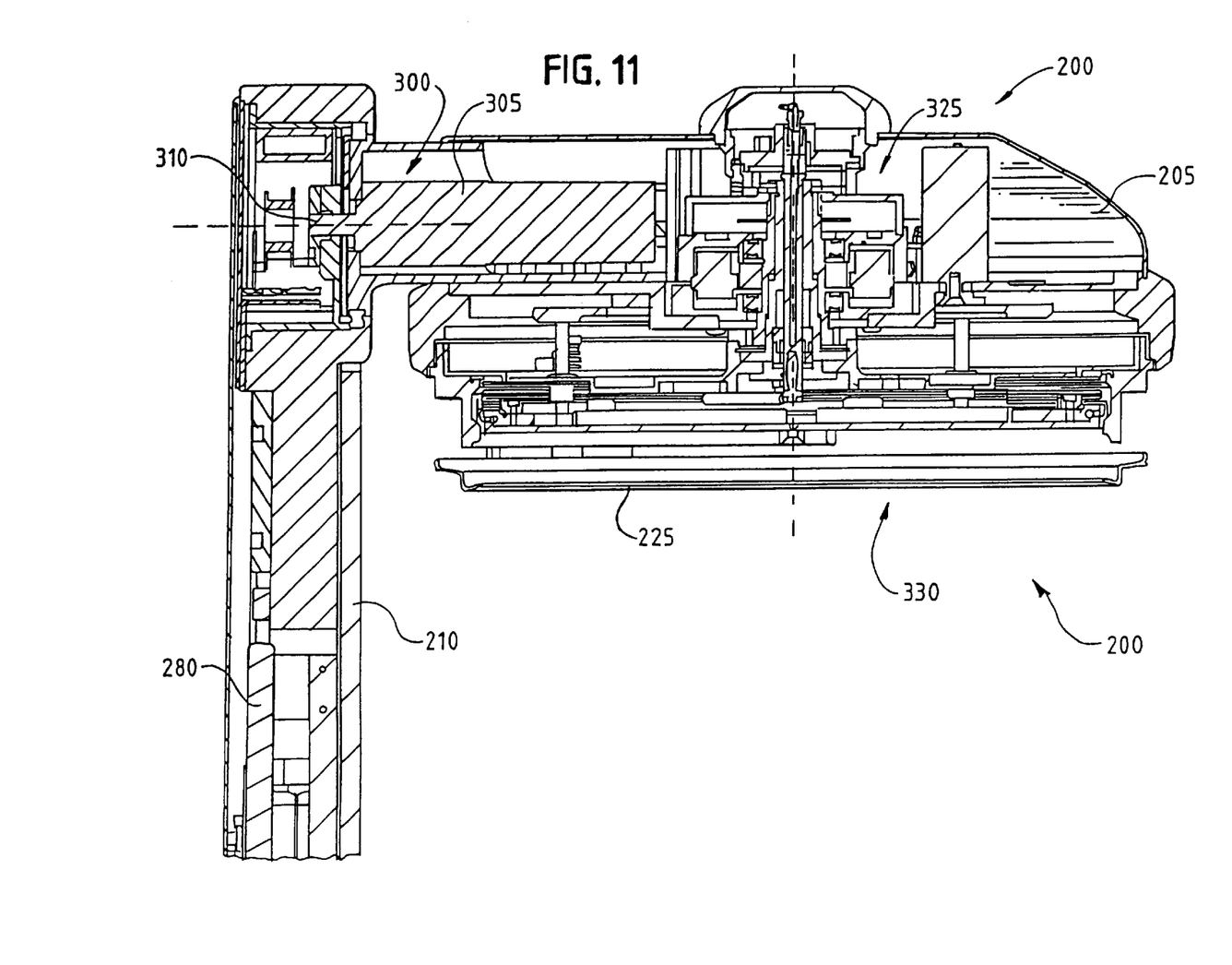
FIG. 11 illustrates a side cross sectional view of the lift and rotate assembly rotated down in the processing position.

The shaft 310 of the motor 305 is coupled to and rotationally fixed with respect to the base 210. By fixing the motor shaft 310, the motor 305 rotates when activated, correspondingly rotating the process head 205. This enables the processing head to be rotated, and the bulk of the motor 305 to be located in the processing head 205. As a result, a base 210 having a reduced depth D is possible.

The process head 205 receives at least one of signals, gases, and fluids from the signals, gases, and fluids supplied to the lift and rotate assembly 200 via the connection box 230 and a cable assembly 297. The cable assembly includes a cable loop 315 for feeding additional length of cable to account for movement by the lift mechanism 255 and the rotating mechanism 300. In positioning the rotating mechanism 300 and the lift mechanism 255, the rotating mechanism 300 has been aligned with the lift mechanism 255 so as to provide a common direction of movement.

By providing a common direction of movement a single cable loop 315 can provide additional cable length for both the lift direction of movement and the rotational direction of movement, thus eliminating the need for a second cable loop. By eliminating the need for a second cable loop further space is conserved within the base 210 of the lift and rotate assembly 200.

The base 210 further includes circuitry 320 for controlling the functioning of the lift and rotate assembly 200.

By locating the bulk of the rotating mechanism 300 in the process head 205 and eliminating the need for a second cable loop, space is conserved in the base 210 of the lift and rotate assembly 200. Correspondingly this allows for the depth D of the lift and rotate assembly 200 to be reduced and greater space on the deck 110 of the processing tool 100 to be available for the processing chamber/bowl 400.

FIG. 11 illustrates a side cross sectional view of the lift and rotate assembly rotated down in the processing position. In addition to illustrating the presence of the bulk of the motor for the rotating mechanism 300 in the processing head, FIG. 11 illustrates a second motor 325 adapted for spinning a received workpiece in a plane parallel to the face 330 of the process head 205.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A method of attaching at least a portion of a workpiece processing station to a tool frame comprising the steps of:

inserting a first pin of the workpiece processing station into a socket located on the exposed surface of a tool frame; and resting a second pin of the workpiece processing station into a saddle located on the exposed surface of a tool frame.

2. The method of claim 1, further comprising the step of resting a third pin of the workpiece processing station against a first receiving surface located on the exposed surface of a tool frame.

3. The method of claim 2, further comprising the step of resting a fourth pin of the workpiece processing station against a second receiving surface located on the exposed surface of a tool frame.

4. The method of claim 2, further comprising the step of adjusting the location of at least one of said socket, said saddle, said first receiving surface and said second receiving surface for adjusting the position of the at least a portion of a workpiece processing station with respect to the tool frame.

5. The method of claim 2, further comprising the step of securing the workpiece processing station to the tool frame via a clamp.

6. The method of claim 5, wherein said step of securing the workpiece processing station includes positioning the clamp over the third pin resting against said first receiving surface captivating said third pin thereagainst.

7. The method of claim 1, wherein said at least a portion of a workpiece processing station is a lift and rotate mechanism for single wafer processing.

* * * * *

UNITED STATES PATENT AND TRADEMARK OFFICE
CERTIFICATE OF CORRECTION

PATENT NO. : 6,322,677 B1
DATED : November 27, 2001
INVENTOR(S) : Daniel J. Woodruff et al.

It is certified that error appears in the above-identified patent and that said Letters Patent is hereby corrected as shown below:

Column 5,
Line 43, "295" should be -- 297 --;

Column 6,
Line 50, delete "2" should be -- 3 --;

Signed and Sealed this

Twenty-seventh Day of August, 2002

Attest:

JAMES E. ROGAN
*Attesting Officer*     *Director of the United States Patent and Trademark Office*